(12) United States Patent
Kanda

(10) Patent No.: US 7,894,251 B2
(45) Date of Patent: Feb. 22, 2011

(54) SEMICONDUCTOR MEMORY DEVICE

(75) Inventor: Akihiko Kanda, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 146 days.

(21) Appl. No.: 12/436,611

(22) Filed: May 6, 2009

(65) Prior Publication Data

US 2009/0296460 A1 Dec. 3, 2009

(30) Foreign Application Priority Data

May 28, 2008 (JP) ............... 2008-139564

(51) Int. Cl.
*G11C 11/00* (2006.01)
(52) U.S. Cl. ............ 365/158; 365/171; 365/203; 365/230.06
(58) Field of Classification Search ........ 365/158, 365/171, 203, 209, 230.06
See application file for complete search history.

(56) References Cited

U.S. PATENT DOCUMENTS

| 5,875,139 | A | 2/1999 | Semi |
|---|---|---|---|
| 6,061,287 | A | 5/2000 | Serizawa |
| 6,529,404 | B2 * | 3/2003 | Hidaka ............... 365/171 |
| 6,657,889 | B1 * | 12/2003 | Subramanian et al. ...... 365/158 |
| 6,958,928 | B2 | 10/2005 | Ooishi |
| 7,646,627 | B2 * | 1/2010 | Hidaka ............... 365/158 |
| 2008/0089137 | A1 * | 4/2008 | Hanzawa et al. ...... 365/189.02 |

FOREIGN PATENT DOCUMENTS

| JP | 10-027474 | 1/1998 |
|---|---|---|
| JP | 10-112185 | 4/1998 |
| JP | 11-250670 | 9/1999 |
| JP | 2000-076863 | 3/2000 |
| JP | 2004-185752 | 7/2004 |

* cited by examiner

*Primary Examiner*—Tuan T Nguyen
*Assistant Examiner*—Toan Le
(74) *Attorney, Agent, or Firm*—McDermott Will & Emery LLP

(57) ABSTRACT

The present invention provides a semiconductor memory device capable of preventing erroneous writing of a data signal. In DL drivers of an MRAM, transistors corresponding to a selected digit line group are made conductive to charge 16 digit lines to power supply voltage and charge a node to a predetermined voltage VP1=VDD−VTH1. After that, a transistor corresponding to the selected digit line is made conductive to make magnetization current flow. Therefore, occurrence of overshooting of magnetization current when the transistor is made conductive can be prevented.

10 Claims, 13 Drawing Sheets

SEMICONDUCTOR MEMORY DEVICE

CROSS-REFERENCE TO RELATED APPLICATIONS

The disclosure of Japanese Patent Application No. 2008-139564 filed on May 28, 2008 including the specification, drawings and abstract is incorporated herein by reference in its entirety.

BACKGROUND OF THE INVENTION

The present invention relates to a semiconductor memory device and, more particularly, to a semiconductor memory device having a memory cell for magnetically storing a data signal.

In recent years, attention is paid to an MRAM (Magnetic Random Access Memory) as a semiconductor memory device capable of storing data in a nonvolatile manner with low power consumption. An MRAM includes a plurality of memory cells MC arranged in a plurality of rows and a plurality of columns, a plurality of digit lines DL provided in correspondence with the plural rows, and a plurality of bit lines BL provided in correspondence with the plural columns. In writing operation, magnetization current Im is made to flow to a selected digit line DL to activate the memory cells MC corresponding to the digit line, and write current Iw in the direction according to the logic of a data signal is made to flow to the selected bit line BL, thereby writing the data signal to the memory cell MC arranged at the cross point of the digital line DL and the bit line BL selected (refer to, for example, Japanese Unexamined Patent Publication No. 2004-185752).

SUMMARY OF THE INVENTION

A conventional MRAM, however, has a problem such that an overshoot occurs in each of the magnetization current Im and the write current Iw in the writing operation, the memory cells MC corresponding to the digit line DL and the bit line BL selected are excessively disturbed, margin of the write characteristics decreases, and erroneous writing of the data signal occurs.

Therefore, a main object of the present invention is to provide a semiconductor memory device capable of preventing erroneous writing of a data signal.

A semiconductor memory device according to the present invention includes a memory array, a row decoder, a column decoder, a digit line driver, and a bit line driver. The memory array includes a plurality of memory cells arranged in a plurality of rows and a plurality of columns and each magnetically storing a data signal, a plurality of digit lines provided in correspondence with the plural rows, and a plurality of bit lines provided in correspondence with the plural columns. The row decoder selects any digit line in the plural digit lines in accordance with a row address signal. The column decoder selects any bit line in the plural bit lines in accordance with a column address signal. The digit line driver makes magnetization current flow to the digit line selected by the row decoder to activate memory cells corresponding to the digit line. The bit line driver makes flow write current in a direction according to logic of a data signal to the bit line selected by the column decoder to write the data signal to the activated memory cell. One ends of the plural digit lines are commonly coupled to a first node that receives a power supply voltage. The digit line driver includes a first transistor, a first constant current element, and a first precharge circuit. The first transistor is provided in correspondence with a digit line, coupled between the other end of the corresponding digit line and a second node, and made conductive when the corresponding digit line is selected by the row decoder. The first constant current element is coupled between the second node and a line of a reference voltage, and makes first constant current flow. The first precharge circuit charges the second node to first voltage before the first transistor is made conductive.

In another semiconductor memory device according to the present invention, the bit line driver includes first to sixth transistors and a precharge circuit. The first transistor is provided in correspondence with a bit line, coupled between one end of the corresponding bit line and a first node, and made conductive when the corresponding bit line is selected by the column decoder. The second transistor is provided in correspondence with a bit line, coupled between the other end of the corresponding bit line and a second node, and made conductive when the corresponding bit line is selected by the column decoder. The third transistor is made conductive in the case of writing a data signal of a first logic to apply the power supply voltage to the first node. The fourth transistor is made conductive in the case of writing a data signal of the first logic to apply the reference voltage to the second node. The fifth transistor is made conductive in the case of writing a data signal of a second logic to apply the power supply voltage to the second node. The sixth transistor is made conductive in the case of writing a data signal of the second logic to apply the reference voltage to the first node. The precharge circuit charges the first and second nodes to a predetermined voltage before the third and fourth transistors or the fifth and sixth transistors are made conductive.

Further another semiconductor memory device according to the present invention includes a plurality of memory cells, a plurality of write current lines, a plurality of transfer gate transistors, a plurality of common wires, and a plurality of write precharge circuits. The plural memory cells are arranged in rows and columns, and each of them magnetically stores data. The plural write current lines are arranged in correspondence with rows or columns of the plural memory cells, and make write current flow on the basis of the potential difference between first and second potentials at the time of writing data to a memory cell. The plural transfer gate transistors are provided in correspondence with the plural write current lines. One conduction terminal of each of the transfer gate transistors is coupled to a corresponding write current line. Each of the plural transfer gate transistors is selectively made conductive in response to an address signal. To each of the plural common wires, the other conduction terminals of a predetermined number in the plural transfer gate transistors are commonly coupled. The plural write precharge circuits are provided in correspondence with the plural common wires, and each precharges a corresponding common wire to a third potential before a corresponding transfer gate transistor is made conductive at the time of the data writing.

In the semiconductor memory device of the present invention, before the first transistor in the digit line driver is made conductive, the second node between the first transistor and the first constant current element is charged to first voltage. Therefore, occurrence of overshooting of the magnetization current when the first transistor is made conductive can be prevented, and occurrence of erroneous writing of a data signal can be prevented.

In the another semiconductor memory device of the present invention, before the third and fourth transistors or the fifth and sixth transistors in the bit line driver are made conductive, the first node between the third and sixth transistors and the second node between the fourth and fifth transistors are charged to predetermined voltage. Therefore, occurrence of overshooting of the write current when the third or fourth transistors or the fifth and sixth transistors are made conductive can be prevented. Occurrence of erroneous writing of the data signal can be prevented.

In further another semiconductor memory device of the present invention, before the transfer gate transistor is made conductive, the common wire to which the other conductive terminal of the transfer gate transistor is coupled is precharged to a third potential. Therefore, occurrence of overshooting of the write current when the transfer gate transistor is made conductive can be prevented, and occurrence of erroneous writing of a data signal can be prevented.

DETAILED DESCRIPTION OF THE PREFERRED EMBODIMENTS

Figure 1:
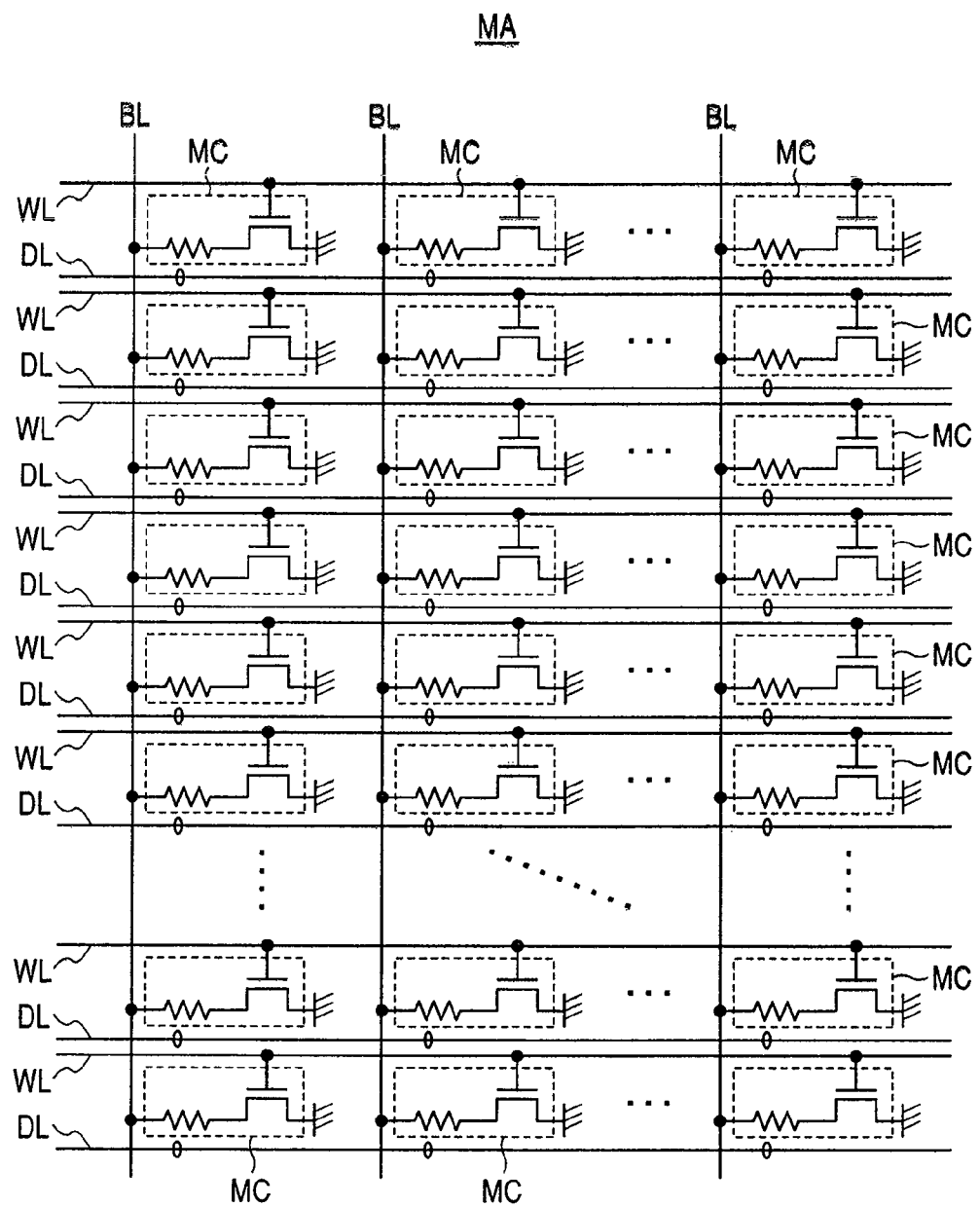
FIG. 1 is a circuit diagram showing the configuration of a memory array of an MRAM as an embodiment of the present invention.

FIG. 1 is a circuit diagram showing the configuration of a memory array MA of an MRAM as an embodiment of the present invention. In FIG. 1, the memory array MA includes a plurality of memory cells MC arranged in a plurality of rows and a plurality of columns (for example, 256 rows and 256 columns), a plurality of word lines WL provided in correspondence with the plural rows, a plurality of digit lines DL provided in correspondence with the plural rows, and a plurality of bit lines BL provided in correspondence with the plural columns.

Figure 2:
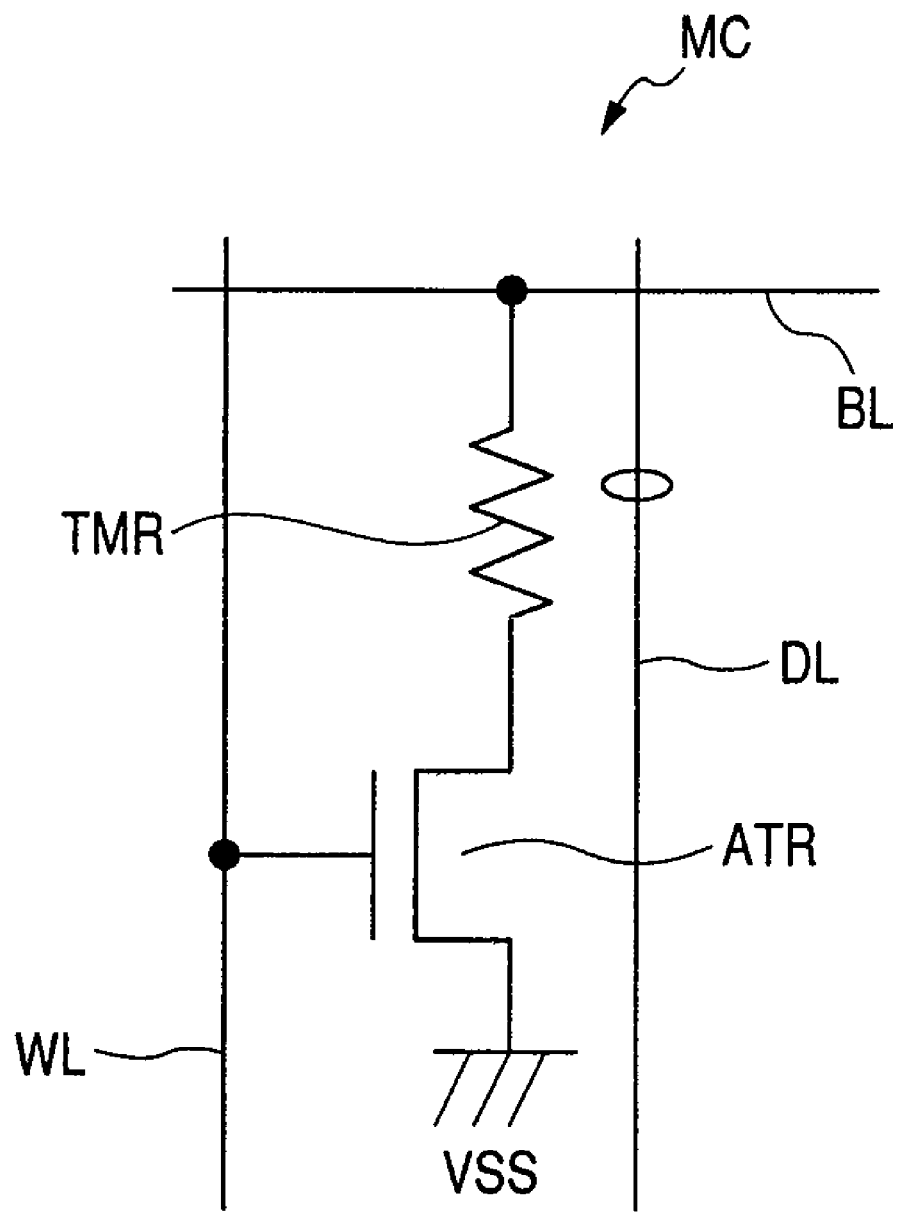
FIG. 2 is a circuit diagram showing the configuration of a memory cell illustrated in FIG. 1.

Each of the memory cells MC includes, as shown in FIG. 2, a tunnel magnetoresistive element TMR and an access transistor (N-channel MOS transistor) ATR. The tunnel magnetoresistive element TMR and the access transistor ATR are coupled in series between the corresponding bit line BL and the line of ground voltage VSS. The gate of the access transistor ATR is coupled to the corresponding word line WL. The tunnel magnetoresistive element TMR is an element whose electric resistance value changes according to the logic of storage data.

Figure 3:
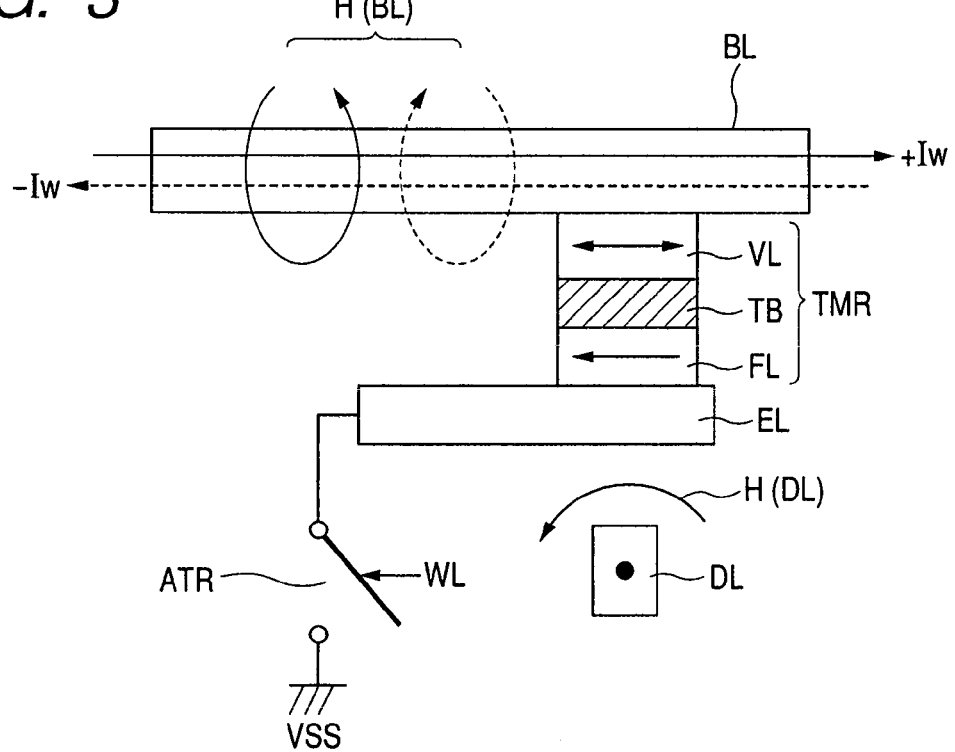
FIG. 3 is a diagram for explaining a method of writing data to the memory cell shown in FIG. 2.

As shown in FIG. 3, the tunnel magnetoresistive element TMR includes a pinned magnetization film FL, a tunnel insulation film TB, and a free magnetization film VL stacked between an electrode EL and a bit line BL. Each of the pinned magnetization film FL and the free magnetization film VL is a ferromagnetic film. The magnetization direction of the pinned magnetization film FL is pinned in one direction. The magnetization direction of the free magnetization film VL is one of the one direction or the other direction. In the case where the magnetization direction of the pinned magnetization film FL and that of the free magnetization film VL are the same, the resistance value of the tunnel magnetoresistive element TMR becomes a relatively large value. In the case where the magnetizations of the films FL and VL are opposite to each other, the electric resistance value of the tunnel magnetoresistive element TMR becomes a relatively small value. The resistance values in two stages of the tunnel magnetoresistive element TMR are associated with, for example, data signals 1 and 0.

In the data writing, as shown in FIG. 3, the word line WL is lowered to the "L" level which is a nonselective level, the access transistor ATR enters a non-conductive state, the magnetization current Im flows in the digit line DL, and the write current Iw is made to flow to the bit line BL. The magnetization direction of the free magnetization direction VL is determined by the combination of the directions of the magnetization current Im and the write current Iw.

Figure 4:
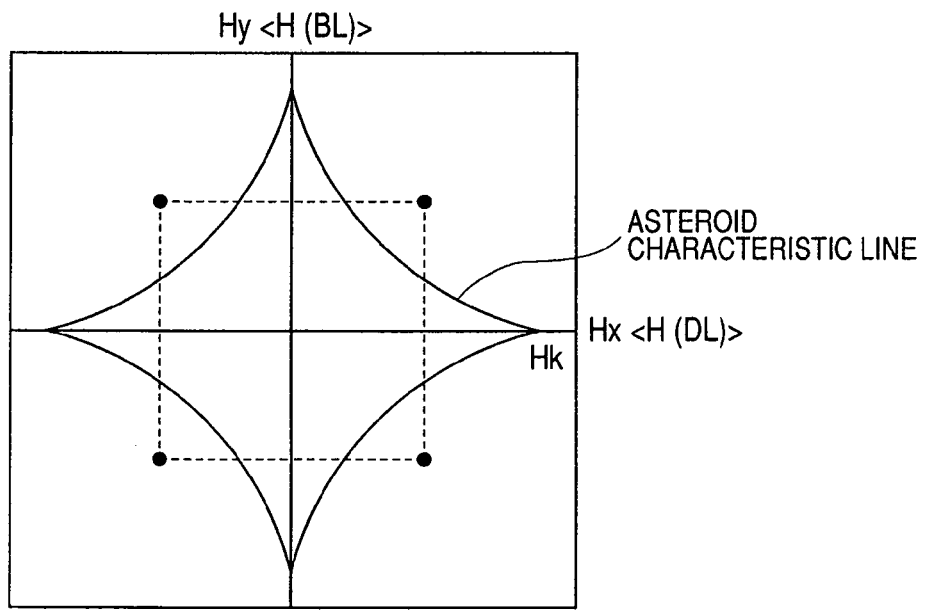
FIG. 4 is another diagram for explaining the method of writing data to the memory cell shown in FIG. 2.

FIG. 4 is a diagram showing the relation between the directions of the magnetization current Im and the write current Iw and the magnetic field direction in the data writing. Referring to FIG. 4, a magnetic field Hx indicated by the lateral axis is a magnetic field H(DL) generated by the magnetization current Im flowing in the digit line DL. On the other hand, a magnetic field Hy indicated by the vertical axis is a magnetic field H(BL) generated by the write current Iw flowing in the bit line BL.

The magnetization field direction stored in the free magnetization film VL is newly written only in the case where the sum of the magnetic fields H(DL) and H(BL) reaches an area on the outside of the asteroid characteristic line. In the case where a magnetic field corresponding to the area on the inside of the asteroid characteristic line is applied, the magnetic field direction stored in the free magnetization film VL is not updated. Therefore, to update data stored in the tunnel magnetoresistive element TMR by the writing operation, current has to be made to flow to both of the digit line DL and the bit line BL. It is assumed here that the magnetization current Im in one direction is made to flow to the digit line DL, and the write current Iw in the direction according to the logic (0 or 1) of the data signal is made to flow to the bit line BL. The magnetic field direction, that is, storage data temporarily stored in the tunnel magnetoresistive element TMR is held in a nonvolatile manner until new data writing is executed.

Figure 5:
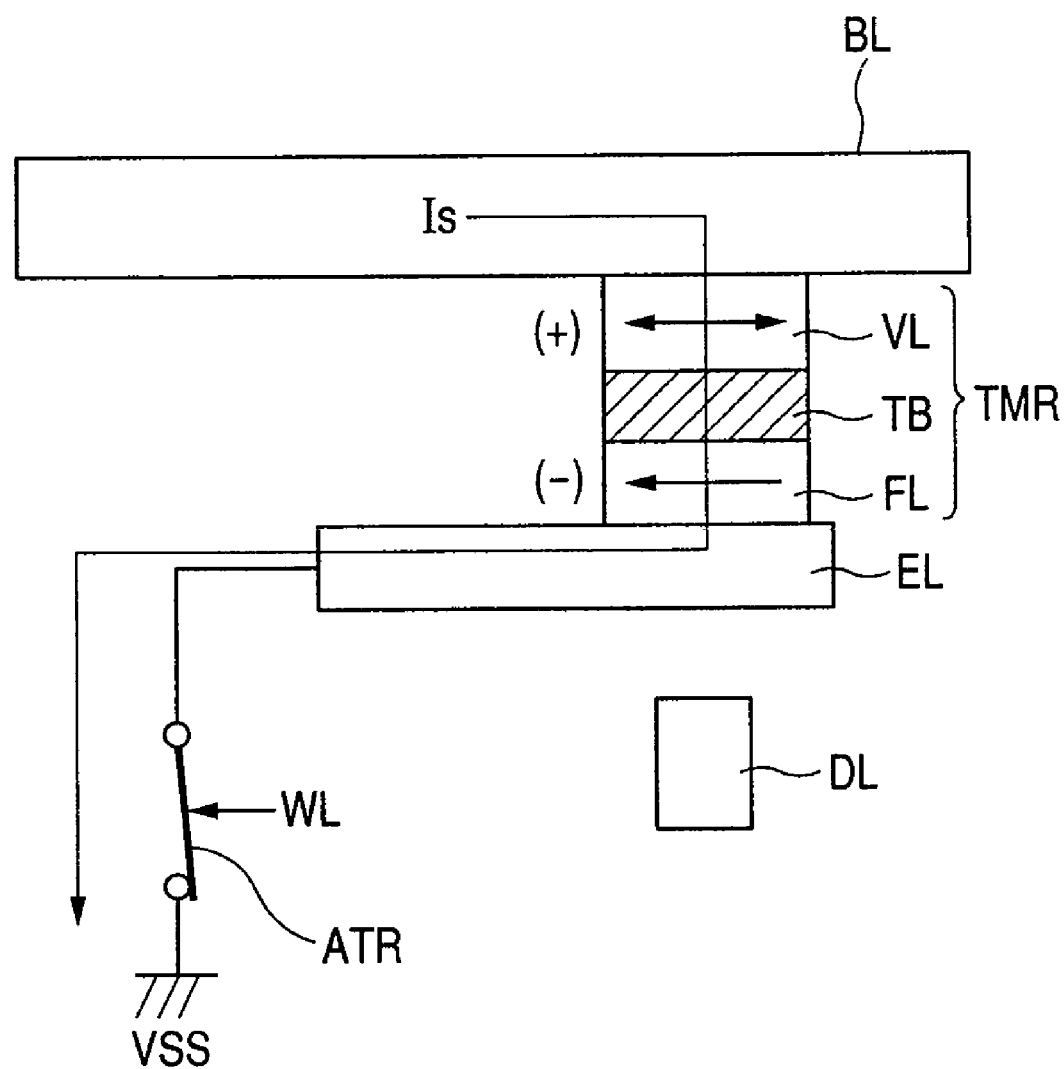
FIG. 5 is a diagram for explaining the method of reading data from the memory cell shown in FIG. 2.

In the data reading operation, as shown in FIG. 5, the word line WL is raised to the "H" level as a selection level, the access transistor ATR is made conductive, and the current Is flows from the bit line BL to the line of the ground voltage VSS via the tunnel magnetoresistive element TMR and the access transistor ATR. The value of the current Is changes according to the resistance value of the tunnel magnetoresistive element TMR. Therefore, by detecting the value of the current Is, data stored in the tunnel magnetoresistive element TMR can be read.

Figure 6:
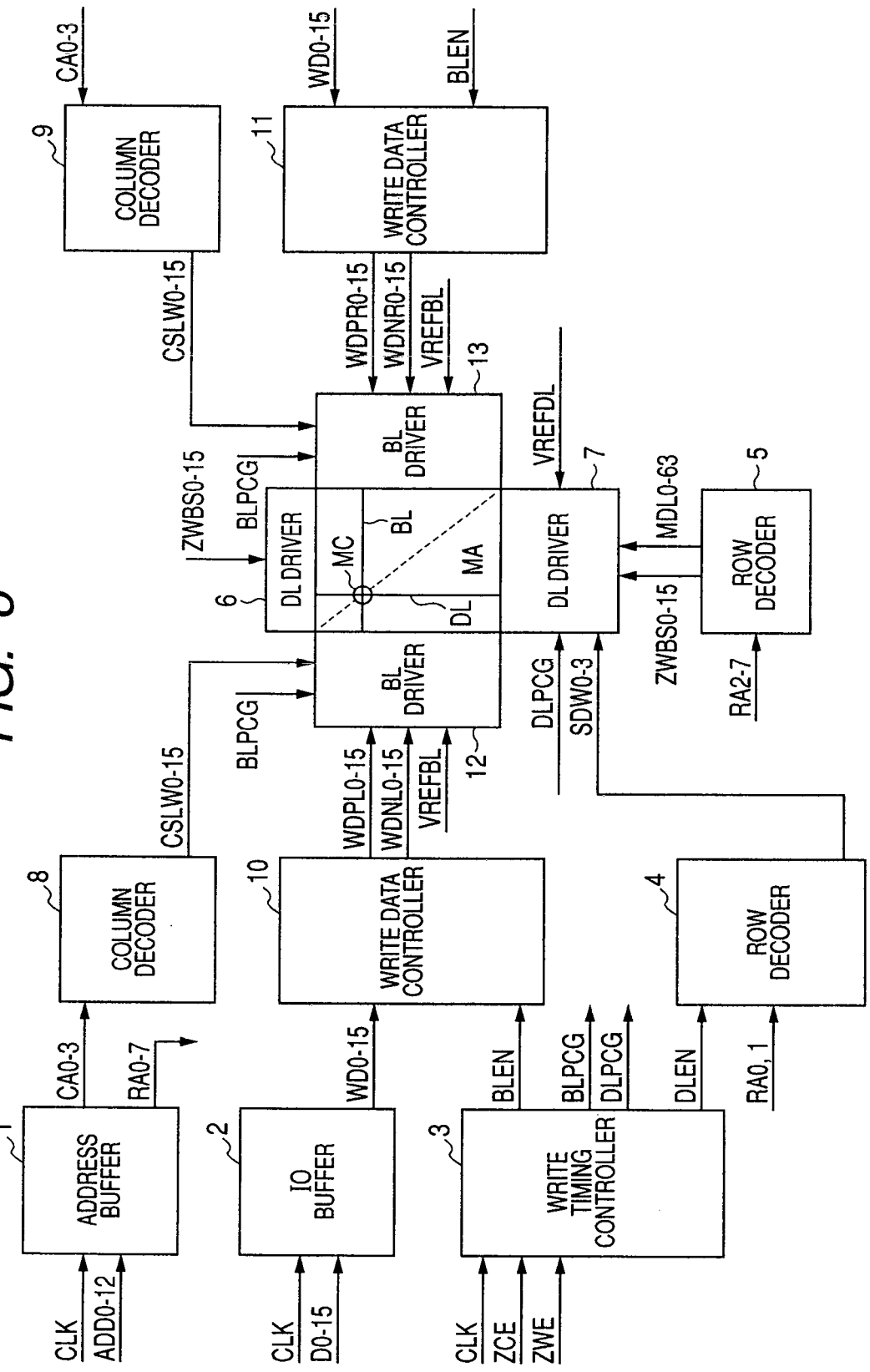
FIG. 6 is a block diagram showing a part related to the data writing of the MRAM illustrated in FIGS. 1 to 5.

FIG. 6 is a block diagram showing a part related to the data writing of the MRAM. The MRAM has, in addition to the memory array MA, an address buffer 1, an IO buffer 2, a write timing controller 3, row decoders 4 and 5, DL drivers 6 and 7, column decoders 8 and 9, write data controllers 10 and 11, and BL drivers 12 and 13.

The address buffer 1 fetches external address signals ADD0 to ADD12 synchronously with the leading edge of a clock signal CLK and generates row address signals RA0 to RA7 and column address signals CA0 to CA3. The IO buffer 2 fetches write data signals D0 to D15 synchronously with the leading edge of he clock signal CLK and generates internal data signals WD0 to WD15.

The write timing controller 3 generates a digit line enable signal DLEN, a digit line precharge signal DLPCG, a bit line enable signal BLEN, and a bit line precharge signal BLPCG when a chip enable signal ZCE and a write enable signal ZWE are lowered to the "L" level as an activation level at the leading edge of the clock signal CLK.

The row decoder 4 generates internal address signals SDW0 to SDW3 on the basis of the digit line enable signal DLEN and the row address signals RA0 and RA1. The row decoder 5 generates internal address signals ZWBS0 to ZWBS15 and MDL0 to MDL63 on the basis of the row address signals RA2 to RA7. The 256 digit lines DL of the memory array MA are pre-set to groups each made of 16 digit lines.

The DL driver 6 selects any one of the 16 digit line groups in accordance with the internal address signals ZWBS0 to ZWBS15, and applies the power supply voltage VDD to one end of each of the 16 digit lines DL belonging to the selected digit line group.

The DL driver 7 selects any one of the 256 digit lines DL in accordance with the internal address signals SDW0 to SDW3 and MDL0 to MDL63, and makes the magnetization current Im of the value according to a reference voltage VREFDL flow from the other end of the selected digit line DL to the line of the ground voltage VSS. The DL driver 7 prevents overshooting of the magnetization current Im by precharging an internal node in response to the digit line precharge signal DLPCG.

Each of the column decoders 8 and 9 generates column selection signals CSLW0 to CSLW15 on the basis of the column address signals CA0 to CA3. The write data controller 10 generates write control signals WDPL0 to WDPL15 and WDNL0 to WDNL15 on the basis of the internal data signals WD0 to WD15 and the bit line enable signal BLEN. The write data controller 11 generates write control signals WDPR0 to WDPR15 and WDNR0 to WDNR15 on the basis of the internal data signals WD0 to WD15 and the bit line enable signal BLEN. The 256 bit lines BL of the memory array MA are pre-set to groups each made of 16 bit lines.

Each of the BL drivers 12 and 13 selects any one of the 16 bit lines BL of each of the 16 bit line groups in accordance with the column selection signals CSLW0 to CSLW15, and selects total 16 bit lines BL. The BL driver 12 operates according to the write control signals WDPL0 to WDPL15 and WDNL0 to WDNL15, and applies the power supply voltage VDD or the ground voltage VSS to one end of each of the selected 16 bit lines BL. The BL driver 13 operates according to the write control signals WDPR0 to WDPR15 and WDNR0 to WDNR15, and applies the ground voltage VSS or the power supply voltage VDD to one end of each of the selected 16 bit lines BL.

In such a manner, the BL drivers 12 and 13 pass the write current Iw in the direction (polarity) according to the logic levels of the write data signals D0 to D15 to each of the selected 16 bit lines BL. The value of the write current Iw is set to a value according to a reference voltage VREFBL. Each of the BL drivers 12 and 13 precharges an internal node in response to the bit line precharge signal BLPCG, thereby preventing overshooting of the write current.

Figure 7:
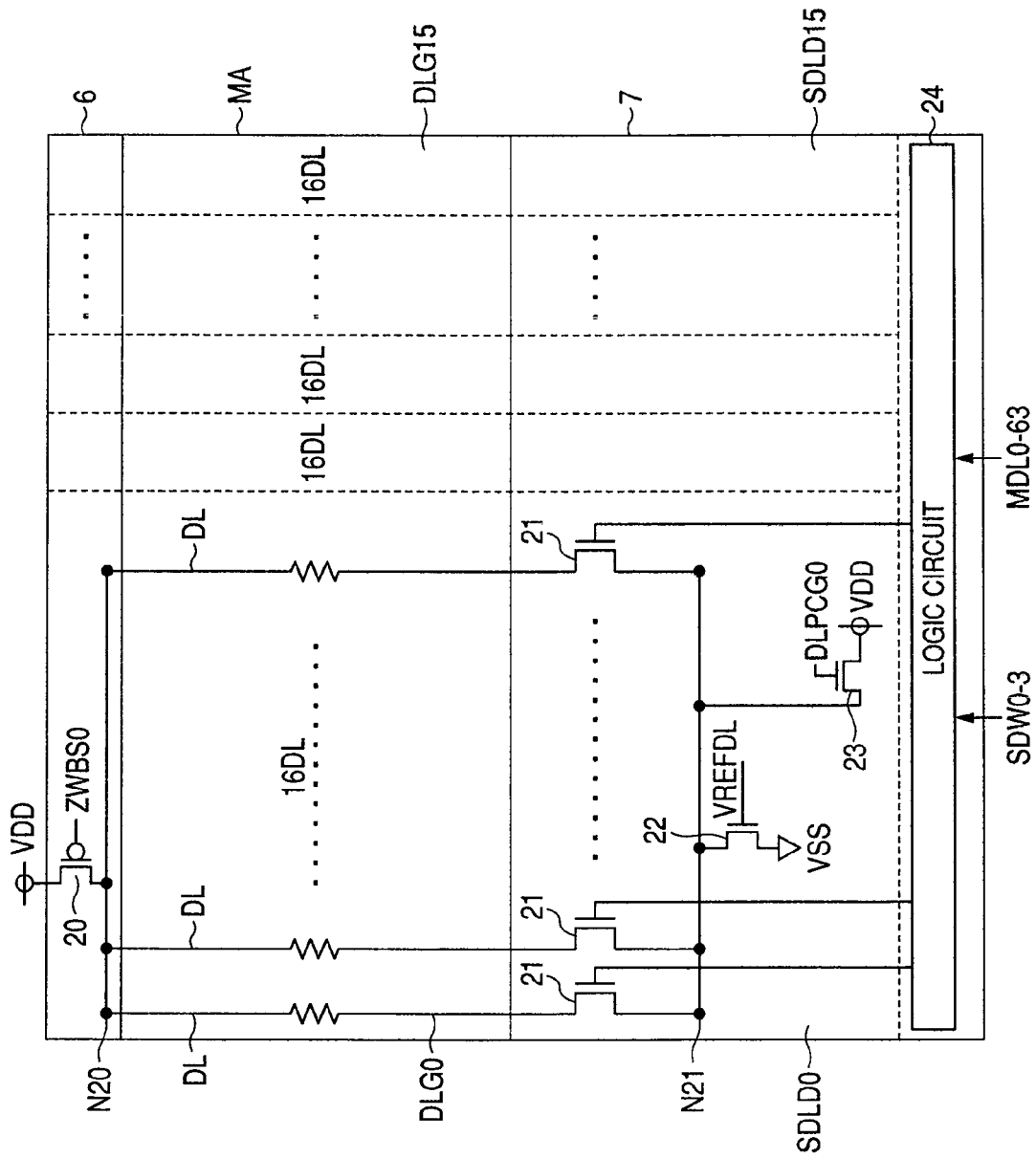
FIG. 7 is a circuit block diagram showing the configuration of a DL driver illustrated in FIG. 6.

FIG. 7 is a circuit diagram showing the configuration of the DL drivers 6 and 7. In FIG. 7, the 256 digit lines DL of the memory array MA are preliminarily divided into 16 digit line groups DLG0 to DLG15 each made of 16 digit lines. One end of each of the 16 digit lines DL belonging to each digit line group DLG is commonly coupled to a node N20. A parasitic resistance exists in each digit line DL.

The DL driver 6 includes 16 P-channel MOS transistors 20 provided in correspondence with 16 digit line groups DLG0 to DLG15. The source of each P-channel MOS transistor 20 receives the supply voltage VDD, and the drain is coupled to the node N20 of the corresponding digit line group DLG. The gates of the 16 P-channel MOS transistors 20 corresponding to the 16 digit line groups DLG0 to DLG15 receive the internal address signals ZWBS0 to ZWBS15.

The DL driver 7 includes 16 sub-DL drivers SDLD0 to SDLD15 provided in correspondence with 16 digit line groups DLG0 to DLG15, and a logic circuit 24. Each of the sub-DL drivers SDLD includes 16 N-channel MOS transistors 21 provided in correspondence with the 16 digit lines DL, and N-channel MOS transistors 22 and 23 commonly provided for the 16 digit lines DL. The drain of each of the N-channel MOS transistors 21 is coupled to the other end of he corresponding digit line DL, and the gate is coupled to the logic circuit 24. The sources of the 16 N-channel MOS transistors 21 are commonly coupled to a node N21.

The N-channel MOS transistor 22 is coupled between the node N21 and the line of the ground voltage VSS, and its gate receives a reference voltage VREFDL. The N-channel MOS transistor 22 serves as a constant current element for making current of a value according to the reference voltage VREFDL flow from the node N21 to the line of the ground voltage VSS.

The N-channel MOS transistor 23 is coupled between the line of the power supply voltage VDD and the node N21. The gates of the 16 N-channel MOS transistors 23 corresponding to the 16 digit line groups DLG0 to DLG15 receive digit line precharge signals DLPCG0 to DLPCG15. The digit line precharge signals DLPCG0 to DLPCG15 are generated from, for example, the digit line precharge signal DLPCG and the row address signals RA0 to RA7.

The logic circuit 24 makes any one of the 256 N-channel MOS transistors 21 conductive in accordance with the internal address signals SDW0 to SDW3 and MDL0 to MDL63.

Figure 8:
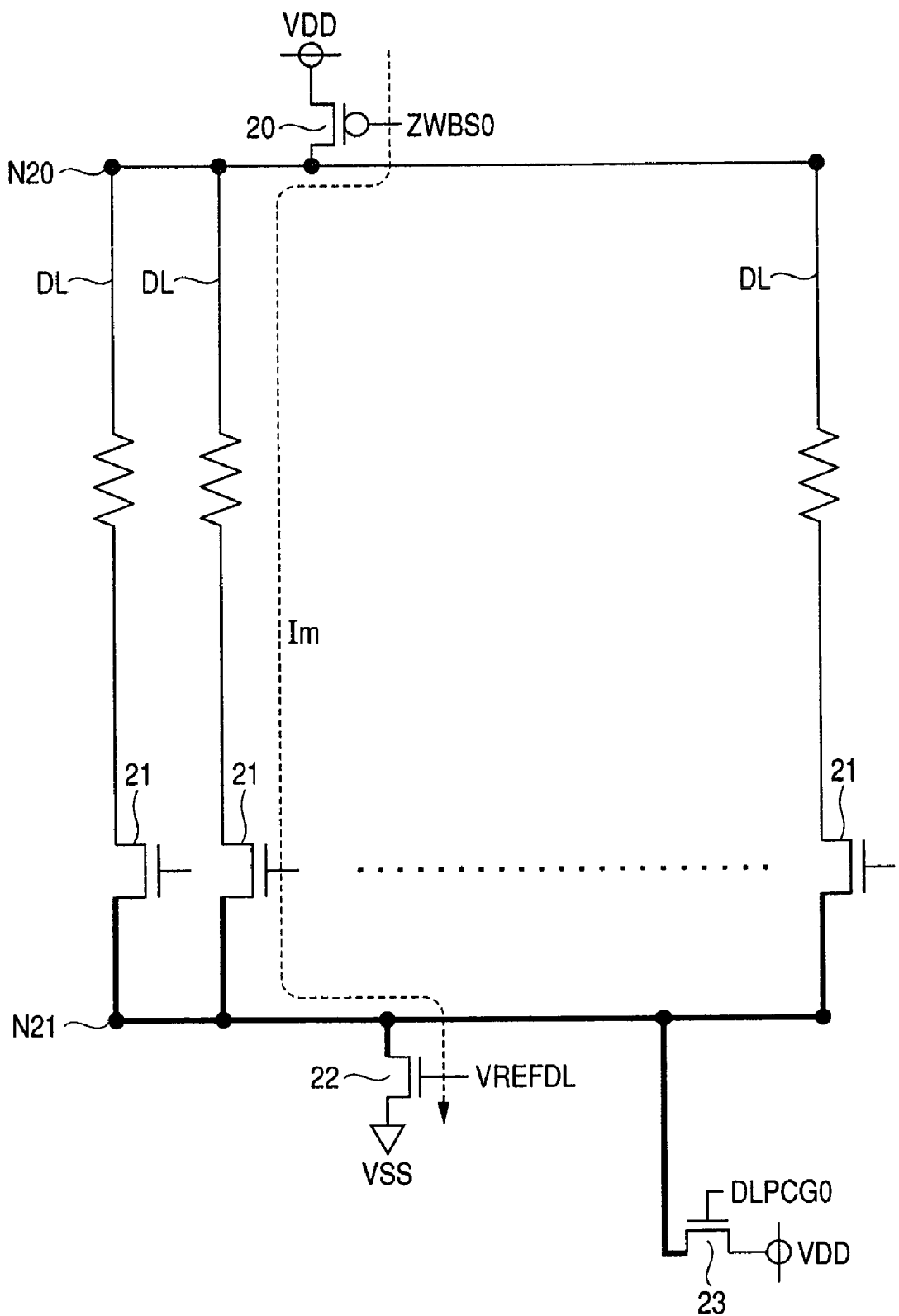
FIG. 8 is a circuit diagram showing the operation of the DL driver illustrated in FIG. 7.
Figure 9:
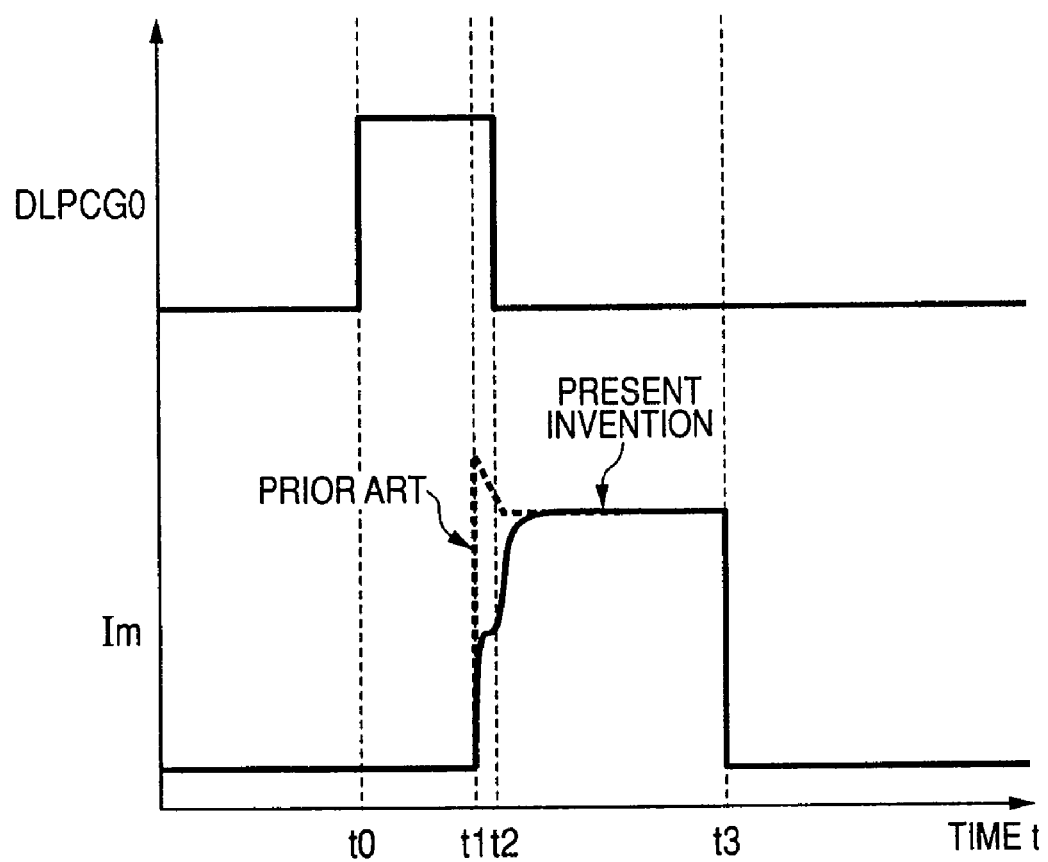
FIG. 9 is a time chart showing the operation of the DL driver illustrated in FIG. 7.

FIG. 8 is a circuit diagram showing the operation of the DL drivers 6 and 7, and FIG. 9 is a time chart showing the operations of the DL drivers 6 and 7. In FIGS. 8 and 9, it is assumed that the second digit line DL from left in FIG. 8 in 16 digit lines DL belonging to the digit line group DLG0 is designated by the internal address signals SDW0 to SDW3 and MDL0 to MDL63.

At time t0, the digit line precharge signal DLPCG0 is raised to the "H" level as the activation level. Accordingly, the N-channel MOS transistor 23 is made conductive, and the node N21 is charged with a predetermined voltage VP1=VDD−VTH1. VTH1 is a threshold voltage of the N-channel MOS transistor 23. At time t0, the internal address signal ZWBS0 is lowered to the "L" level as the activation level. Accordingly, the P-channel MOS transistor 20 is made conductive, and the 16 digit lines DL are charged with the power supply voltage VDD.

At time t1, the N-channel MOS transistor 21 corresponding to the selected digit line DL is made conductive, and the magnetization current Im flows in the digit line DL. Since the node N21 is charged to the predetermined voltage VP1, overshoot of the magnetization current Im does not occur.

Conventionally, the N-channel MOS transistor 23 is not provided, and the node N21 is not precharged. Consequently, when the N-channel MOS transistor 21 corresponding to the selected digit line DL is made conductive, large current to charge the parasitic capacitance in the node N21, that is, the source capacitance in the 16 N-channel MOS transistors 21 and the drain capacitance of the N-channel MOS transistor 22 flows transiently, and overshooting of the magnetization current Im occurs.

When the overshooting of the magnetization current Im occurs, each of the memory cells MC corresponding to the selected digit line DL is excessively disturbed, and the margin of the write characteristic decreases. Consequently, there is conventionally a problem such that erroneous writing occurrence probability is high. In contrast, in the present invention, overshooting of the magnetization current Im does not occur, so that the margin of the write characteristic can be maintained high, and the erroneous writing occurrence probability can be made low.

At time t2, the digit line precharge signal DLPCG0 is lowered to the "L" level as the non-activation level, the N-channel MOS transistor 23 is made nonconductive, and the precharging is stopped. At time t3 after lapse of predetermined time since the time t2, the transistor 21 is made nonconductive, and the magnetization current Im is interrupted.

In the period from time t1 to time t2, all of the transistors 20, 21, and 23 are made conductive for the reason that, when the transistor 23 is made nonconductive before the transistor 21 is made conductive, charges accumulated in the node N21 flow via the transistor 22 to the line of the ground voltage VSS, the voltage of the node N21 drops, and the effect of precharging the node N21 is lost.

Figure 10:
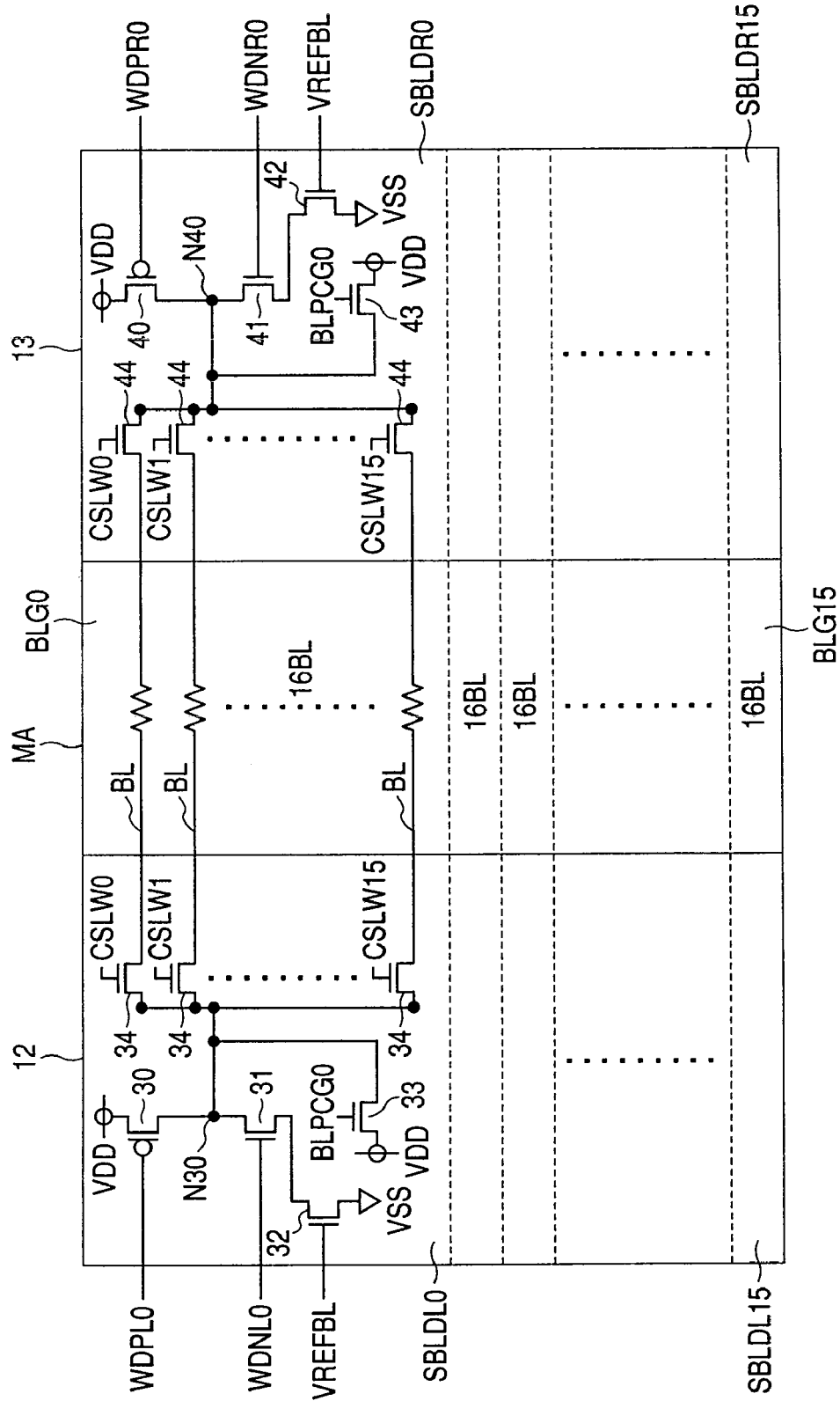
FIG. 10 is a circuit block diagram showing the configuration of a sub-BL driver illustrated in FIG. 6.

FIG. 10 is a circuit diagram showing the configuration of the BL drivers 12 and 13. In FIG. 10, 256 bit lines BL of the memory array MA are divided into 16 bit line groups BLG0 to BLG15 each made of 16 bit lines. A parasitic resistance exists in each bit line BL.

The DL driver 12 includes 16 sub-BL drivers SBLDL0 to SBLDL15 provided in correspondence with 16 bit line groups BLG0 to BLG15, respectively. The sub-BL driver SBLDL0 includes a P-channel MOS transistor 30, N-channel MOS transistors 31 to 33, and 16 N-channel MOS transistors 34 provided in correspondence with the 16 bit lines BL.

The P-channel MOS transistor 30 is coupled between the line of the power supply voltage VDD and a node N30, and its gate receives the write control signal WDPL0. The drain of the N-channel MOS transistor 31 is coupled to the node N30, and the gate receives the write control signal WDNL0. The N-channel MOS transistor 32 is coupled between the source of the N-channel MOS transistor 31 and the line of the ground voltage VSS, and its gate receives the reference voltage VREFBL. The N-channel MOS transistor 32 serves as a constant current element for making current of a value according to the reference voltage VREFBL flow.

The N-channel MOS transistor 33 is coupled between the line of the power supply voltage VDD and the node N30. The gates of the 16 N-channel MOS transistors 33 corresponding to the 16 digit line groups BLG0 to BLG15 receive bit line precharge signals BLPCG0 to BLPCG15. The bit line precharge signals BLPCG0 to BLPCG15 are generated from, for example, the bit line precharge signal DLPCG and the column address signals CA0 to CA3. The 16 N-channel MOS transistors 34 are coupled between one ends of 16 bit lines BL and the node N30, and their gates receive the column selection signals CSLW0 to CSLW15. The other sub-BL drivers SBLDL1 to SBLDL15 have the same configuration as that of the sub-BL driver SLBDL0 except for the point that they receive signals WDPL1, WDNL1, BLPCG1, . . . , and WDPL15, WDNL15, and BLPCG15 in place of the signals WDPL0, WDNL0, and BLPCG0.

The DL driver 13 includes 16 sub-BL drivers SBLDR0 to SBLDR15 provided in correspondence with 16 bit line groups BLG0 to BLG15, respectively. The sub-BL driver SBLDR0 includes a P-channel MOS transistor 40, N-channel MOS transistors 41 to 43, and 16 N-channel MOS transistors 44 provided in correspondence with 16 bit lines BL.

The P-channel MOS transistor 40 is coupled between the line of the power supply voltage VDD and a node N40, and its gate receives a write control signal WDPR0. The drain of the N-channel MOS transistor 41 is coupled to the node N40, and its gate receives a write control signal WDNR0. The N-channel MOS transistor 42 is coupled between the source of the N-channel MOS transistor 41 and the line of the ground voltage VSS, and its gate receives a reference voltage VREFBL. The N-channel MOS transistor 42 serves as a constant current element for making current of a value according to the reference voltage VREFBL flow.

The N-channel MOS transistor 43 is coupled between the line of the power supply voltage VDD and the node N40. The gates of the 16 N-channel MOS transistors 43 corresponding to the 16 bit line groups BLG0 to BLG15 receive bit line precharge signals BLPCG0 to BLPCG15. The 16 N-channel MOS transistors 44 are coupled between the other ends of the 16 bit lines BL and the node N40, and their gates receive column selection signals CSLW0 to CSLW15. The other sub-BL drivers SBLDR1 to SBLDR15 have the same configuration as that of the sub-BL driver SBLDR0 except for the point that they receive signals WDPR1, WDNR1, BLPCG1, . . . , and WDPR15, WDNR15, and BLPCG15 in place of the signals WDPR0, WDNR0, and BLPCG0.

Figure 11:
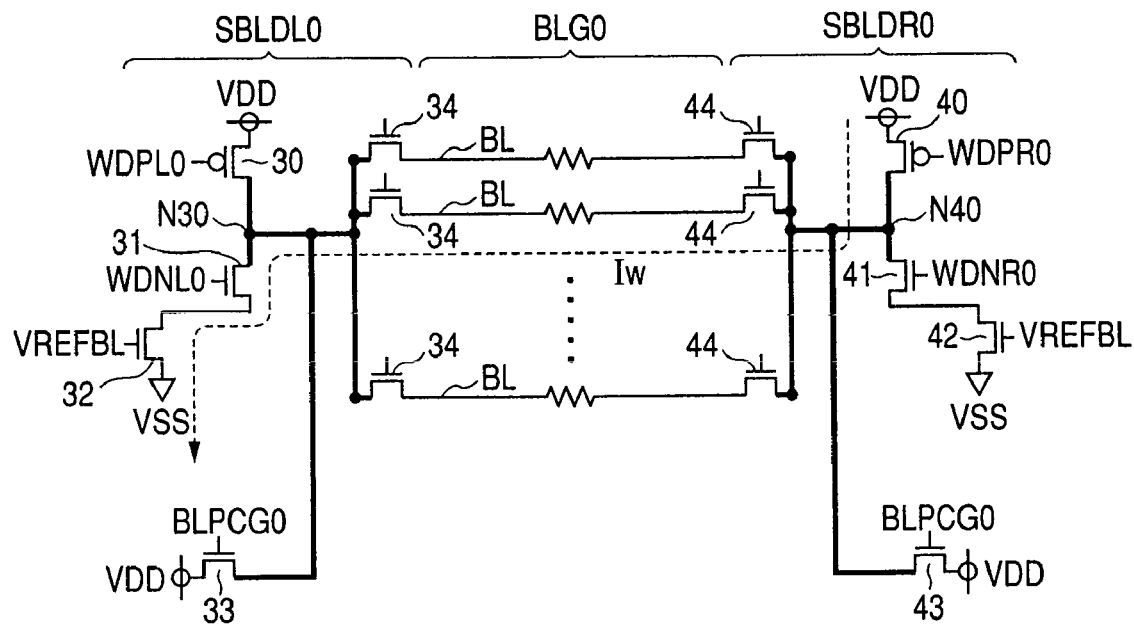
FIG. 11 is a circuit diagram showing the operation of the sub-BL driver illustrated in FIG. 10.
Figure 12:
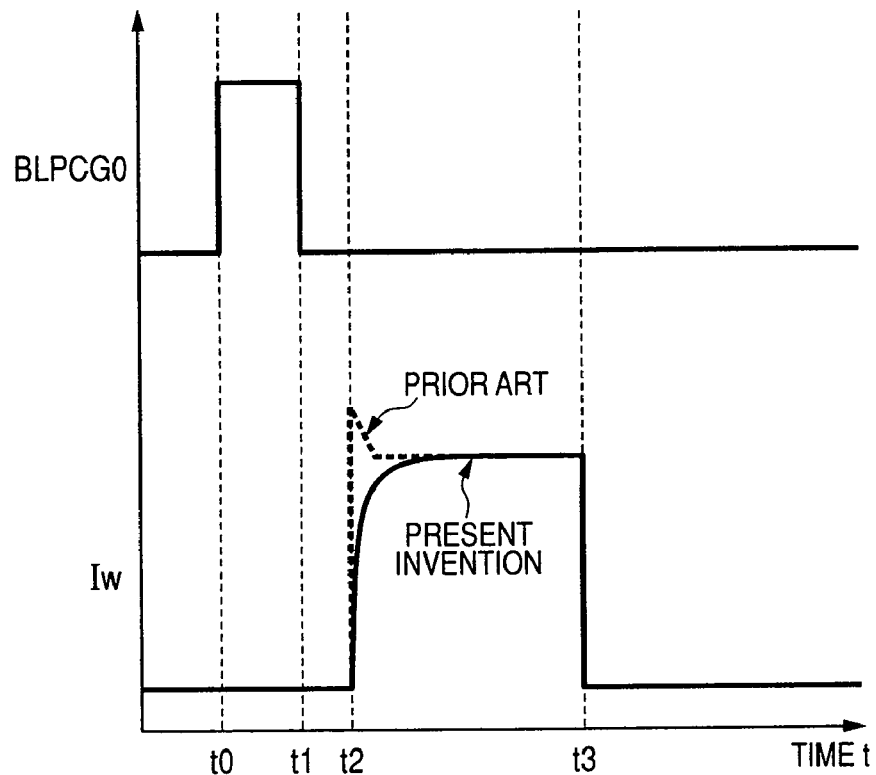
FIG. 12 is a time chart showing the operation of the sub-BL driver illustrated in FIG. 10.

FIG. 11 is a circuit diagram showing the operation of the sub-BL drivers SBLDL0 and SBLDR0, and FIG. 12 is a time chart showing the operations of the sub-BL drivers SBLDL0 and SBLDR0. In FIGS. 11 and 12, it is assumed that the second bit line BL from top in FIG. 11 in 16 bit lines BL belonging to the bit line group BLG0 is selected by the column selection signals CSLW0 to CSLW15. It is also assumed that the write current Iw is made to flow to the bit line BL from the right side to the left side in FIG. 11 by the write control signals WDPL0, WDNL0, WDPR0, and WDNR0. In the initial state, the transistors 30, 31, 33, 34, 40, 41, 43, and 44 are in the non-conductive state.

At time t0, the bit line precharge signal BLPCG0 is raised to the "H" level as the activation level. Accordingly, the N-channel MOS transistors 33 and 43 are made conductive, and the nodes N30 and N40 are charged to a predetermined voltage VP2=VDD−VTH2. VTH2 is a threshold voltage of the N-channel MOS transistors 33 and 43. At time t1, the bit line precharge signal BLPCG0 is lowered to the "L" level as the non-activation level, the N-channel MOS transistors 33 and 43 are made nonconductive, and precharging is stopped.

Next, the column selection signal CSLW1 is set to the "H" level as the activation level, and the N-channel MOS transistors 34 and 44 corresponding to the selected bit line BL are made conductive. Subsequently, at time t2, the write control signal WDNL0 is set to the "H" level as the activation level, the write control signal WDPR0 is lowered to the "L" level as the activation level, and the transistors 31 and 40 are made conductive.

As a result, the write current Iw flows from the line of the power supply voltage VDD to the line of the ground voltage VSS via the transistors 40 and 44, the bit line BL, and the transistors 34, 31, and 32. Since the nodes N30 and N40 are charged to the predetermined voltage VP2, overshoot of the write current Iw does not occur. At time t3 after lapse of the predetermined time since time t2, the transistors 31 and 40 are made non-conductive, and the write current Iw is interrupted.

By the Passage of the write current Iw to the bit line BL from the right side toward the left side in FIG. 11, for example, data "1" is written in the memory cell MC at the cross point of the bit line BL and the digital line DL selected. In the case of writing data "0" in the memory cell MC, it is sufficient to make the transistors 30 and 41 conductive in place of the transistors 31 and 40 to pass the write current Iw to the bit line BL from the left side toward the right side in FIG. 11. Since the operation of the other sub-BL drivers SBLDL1 and SBLDR1 to SBLDL15 and SBLDR15 is similar to that of the sub-BL drivers SBLDL0 and SBLDR0, its description will not be repeated.

Conventionally, the N-channel MOS transistors 33 and 43 are not provided, and the nodes N30 and N40 are not precharged. Consequently, when the N-channel MOS transistors 34 and 44 corresponding to the selected bit line BL and the transistors 31 and 40 or the transistors 30 and 41 are made conductive, large current to charge the parasitic capacitance in the node N30 (that is, the drain capacitance in the transistors 30 to 32 and the source/drain capacitance of the 16 transistors 34) or the parasitic capacitance in the node N40 (that is, the drain capacitance in the transistors 40 to 42 and the source/drain capacitance of the 16 transistors 44) flows transiently, and overshooting of the write current Iw occurs as shown in FIG. 12.

When the overshooting of the write current Iw occurs, each of the memory cells MC corresponding to the selected bit line BL is excessively disturbed, and the margin of the write characteristic decreases. Consequently, there is conventionally a problem such that erroneous writing occurrence probability is high. In contrast, in the present invention, overshooting of the write current Im does not occur, so that the margin of the write characteristic can be maintained high, and the erroneous writing occurrence probability can be made low.

Figure 13:
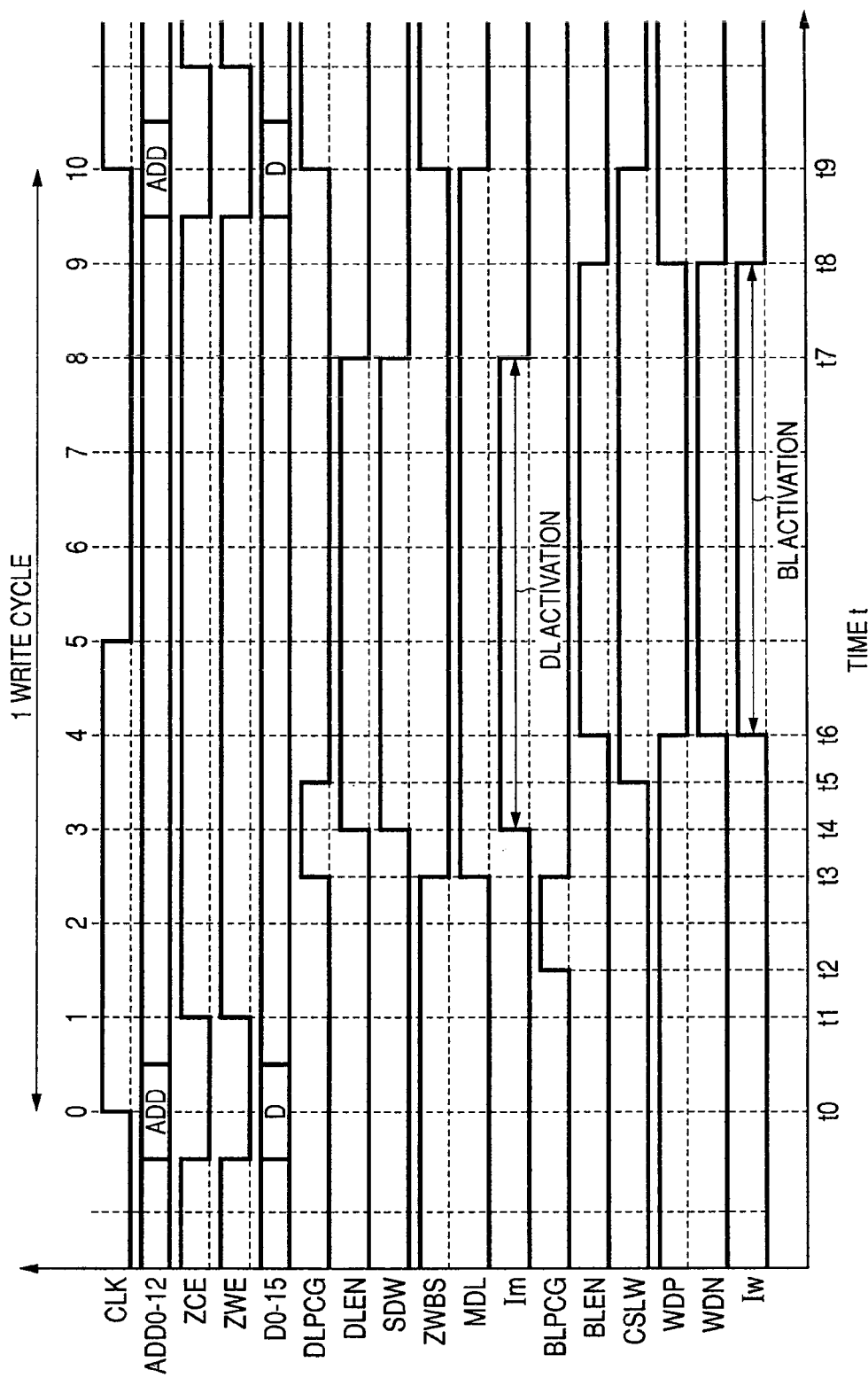
FIG. 13 is a time chart showing the writing operation of the MRAM illustrated in FIGS. 6 to 12.

FIG. 13 is a time chart showing the writing operation of the MRAM. In FIG. 13, the cycle of 1/10 of the clock signal CLK is one unit time. At time t0, when the chip enable signal ZCE and the write enable signal ZWE are lowered to the "L" level as the activation level at the leading edge of the clock signal CLK, a write command is recognized, and the external address signals ADD0 to ADD12 and the write data signals D0 to D15 are fetched. At time t1 after lapse of one unit time since the time t0, both of the signals ZCE and ZWE are raised to the "H" level as the non-activation level.

At time t2 after lapse of 1.5 unit time since time t0, the bit line precharge signal BLPCG is raised to the "H" level as the activation level, the N-channel MOS transistors 33 and 43 of the sub-BL drivers SBLDL and SBLDR are made conductive, and the nodes N30 and N40 are precharged to the predetermined voltage VP2.

At time t3 after lapse of 1 unit time since time t2, the bit line precharge signal BLPCG is lowered to the "L" level as the non-activation level, the N-channel MOS transistors 33 and 43 of the sub-BL drivers SBLDL and SBLDR are made nonconductive, and precharging of the nodes N30 and N40 is stopped. At time t3, the digit line precharge signal DLPCG is raised to the "H" level as the activation level, the N-channel MOS transistor 23 of the selected sub-DL driver SDLD is made conductive, and the node N21 is precharged to the predetermined voltage VP1. At time t3, the internal address signals ZWBS and MDL are generated, the N-channel MOS transistor 20 corresponding to the selected digit line group DLG is made conductive, and 16 digit lines DL are charged with the power supply voltage VDD.

At time t4 after lapse of 0.5 unit time since time t3, the digit line enable signal DLEN is raised to the "H" level as the activation level, the internal address signal SDW is generated, the N-channel MOS transistor 21 corresponding to the selected digit line DL is made conductive, and the magnetization current Im is made to flow to the digit line DL. Overshooting of the magnetization current Im does not occur as shown in FIG. 9.

At time t5 after lapse of 0.5 unit time since time t4, the digit line precharge signal DLPCG is lowered to the "L" level as the non-activation level, the N-channel MOS transistor 23 of the selected sub-DB driver SDLD is made nonconductive, and precharging of the node N21 is stopped. At time t4, the column selection signal CSLW is generated, the N-channel MOS transistors 34 and 44 corresponding to the selected bit line BL in the 16 bit lines BL belonging to each of the bit line groups BLG are made conductive, and the selected bit line BL is coupled to the nodes N30 and N40 of the corresponding sub-BL drivers SBLDL and SBLDR.

At time t6 after lapse of 0.5 unit time since time t5, the bit line enable signal BLEN is raised to the "H" level as the activation level, the write control signals WDP and WDN are generated, the transistors 31 and 40 or 30 and 41 corresponding to the selected bit line BL are made conductive, and the write current Iw is made to flow to the selected bit line BL. Overshooting of the write current Iw does not occur as shown in FIG. 12. During the four-unit time since time t6, this state is maintained, and the data signals D0 to D15 are written in the selected 16 memory cells MC.

At time t7 after lapse of four-nit time since time t6, the digit line enable signal DLEN is lowered to the "L" level as the non-activation level, and the internal address signal SDW is reset. As a result, the N-channel MOS transistor 21 of the DL driver 7 is made nonconductive, and the magnetization current Im is interrupted.

At time t8 after lapse of one unit time since time t7, the bit line enable signal BLEN is lowered to the "L" level as the non-activation level, and the write control signals WDP and WDN are reset. The transistors 30, 31, 40, and 41 of the BL drivers 12 and 13 are made nonconductive, and the write current Iw is interrupted.

At time t9 after lapse of one unit time since time t8, the internal address signals ZWBS and MDL are reset, and the P-channel MOS transistor 20 of the DL driver 6 is made nonconductive. At time t9, the column selection signal CSLW is reset, and the N-channel MOS transistors 34 and 44 of the sub-BL drivers SBLDL and SBLDR are made nonconductive. It ends the writing operation.

Figure 14:
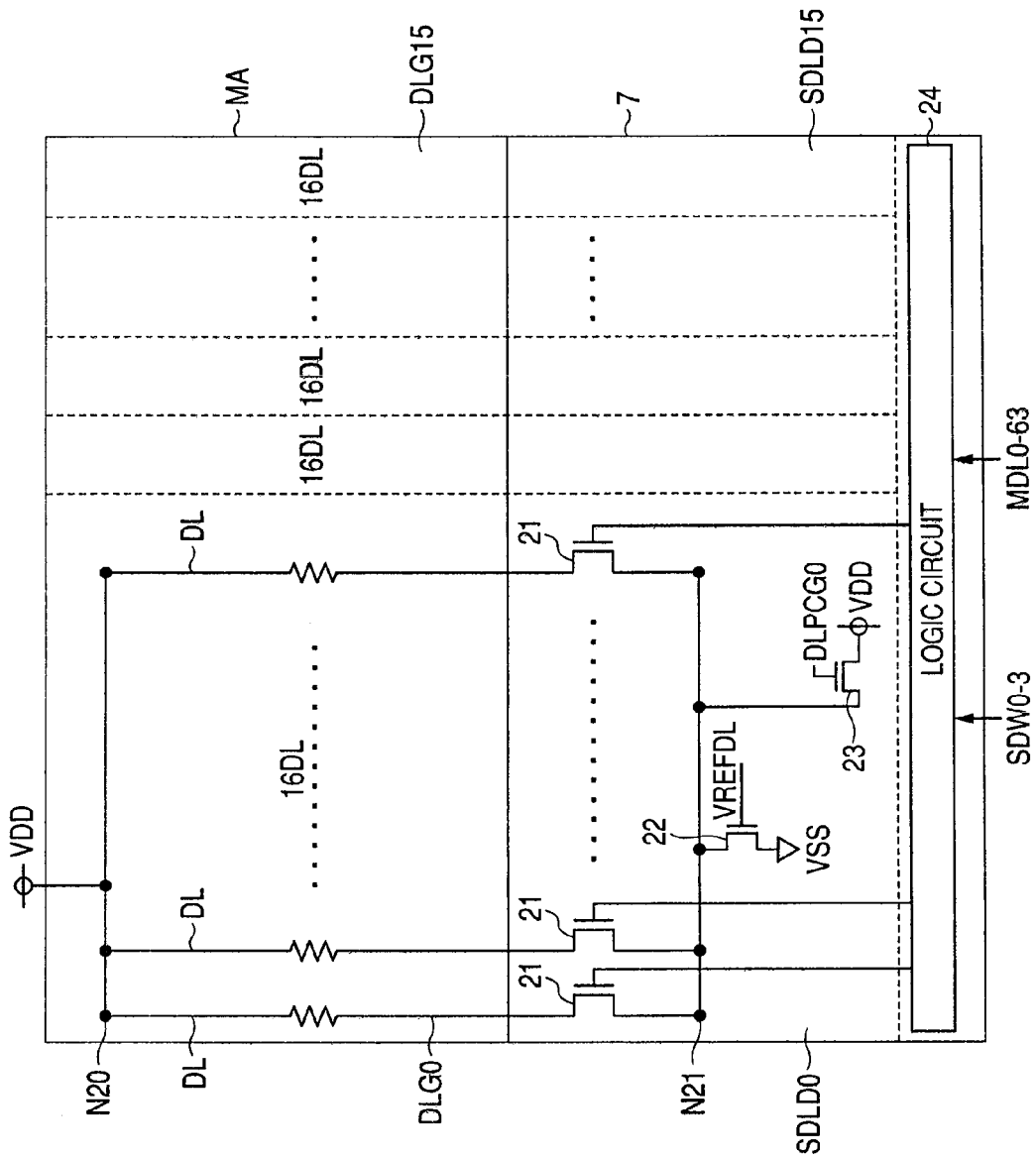
FIG. 14 is a circuit block diagram showing a modification of the embodiment.

FIG. 14 is a diagram showing a modification of the embodiment and is compared with FIG. 7. In FIG. 14, in the modification, the DL driver 6 is eliminated, and the power supply voltage VDD is always applied to the node N20. In the modification, the same effect as that of the embodiment is obtained and, in addition, the layout area is decreased only by the amount of the DL driver 6.

Figure 15:
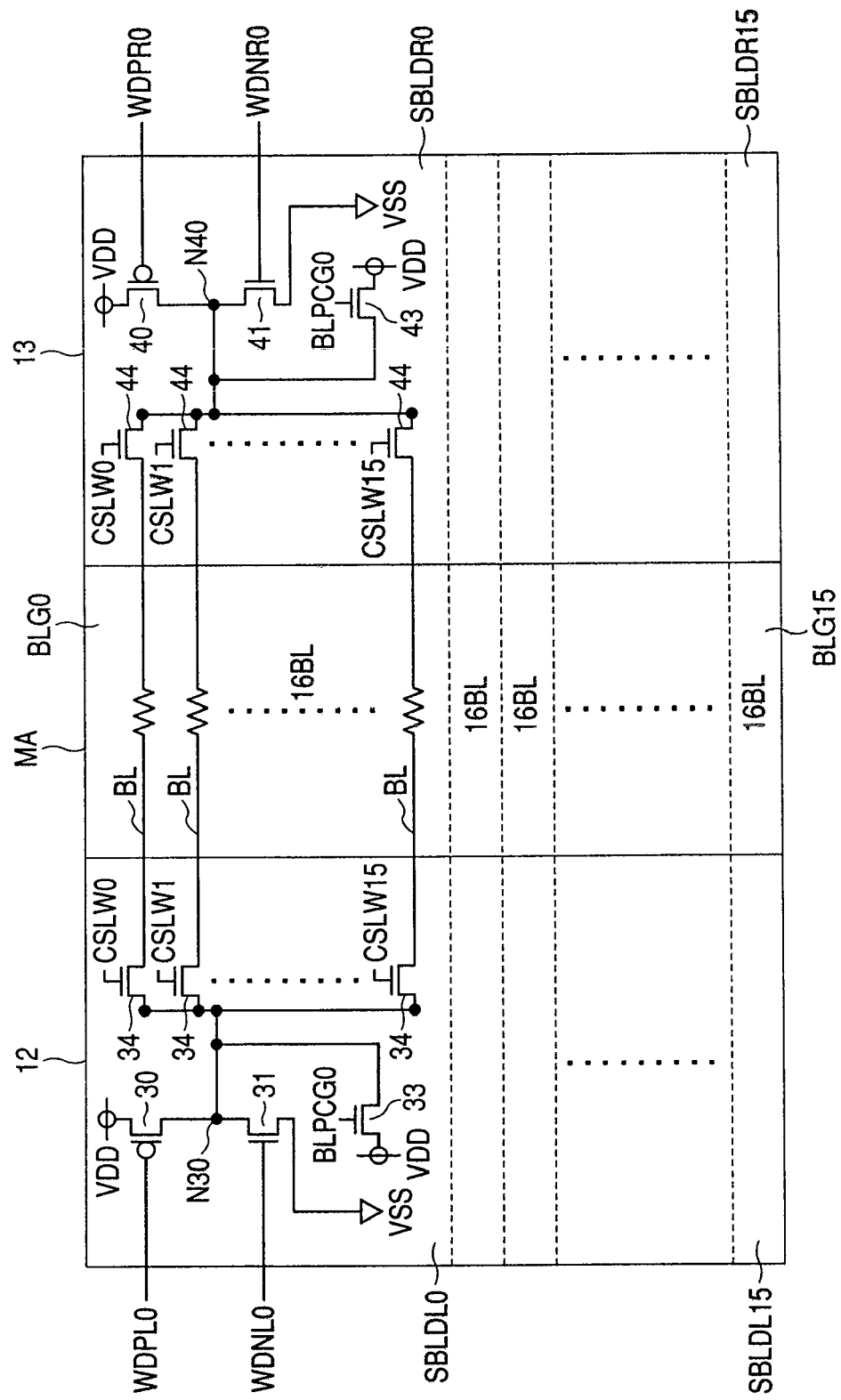
FIG. 15 is a circuit diagram showing another modification of the embodiment.

FIG. 15 is a diagram showing another modification of the embodiment and is compared with FIG. 10. In FIG. 15, in the modification, the N-channel MOS transistors 32 and 42 of the sub-BL drivers SBLDL and SBLDR are eliminated, and the sources of the N-channel MOS transistors 31 and 41 are directly coupled to the line of the ground voltage VSS. The size (gate length and gate width) of each of the N-channel MOS transistors 31 and 41 is preset so as to pass a predetermined current.

In the modification, the same effect as that of the embodiment is obtained, and the N-channel MOS transistors 32 and 42, the circuit for generating the reference voltage VREFBL, and the wire for the reference voltage VREFBL are made unnecessary, and the layout circuit is decreased only by the amount of those parts.

It should be understood that the embodiments disclosed herein are illustrative not restrictive in all aspects. The scope of the present invention is defined not by the above description but by the scope of the claims, and it is intended that all changes are intended to be within the scope of claims and equivalence of such meets and bounds.

What is claimed is:

1. A semiconductor memory device comprising:
   a memory array including: a plurality of memory cells arranged in a plurality of rows and a plurality of columns and each magnetically storing a data signal; a plurality of digit lines provided in correspondence with the rows; and a plurality of bit lines provided in correspondence with the columns;
   a row decoder for selecting any digit line in the digit lines in accordance with a row address signal;
   a column decoder for selecting any bit line in the bit lines in accordance with a column address signal;
   a digit line driver for making magnetization current flow to the digit line selected by the row decoder to activate memory cells corresponding to the digit line; and
   a bit line driver for making write current flow in a direction according to logic of a data signal to the bit line selected by the column decoder to write the data signal to the activated memory cell,
   wherein one ends of the digit lines are commonly coupled to a first node that receives a power supply voltage, and
   wherein the digit line driver includes:
   a first transistor which is provided in correspondence with a digit line, coupled between the other end of the corresponding digit line and a second node, and made conductive when the corresponding digit line is selected by the row decoder;
   a first constant current element coupled between the second node and a line of a reference voltage, and making first constant current flow; and
   a first precharge circuit for charging the second node to first voltage before the first transistor is made conductive.

2. The semiconductor memory device according to claim 1, wherein the digit line driver further includes a second transistor which is coupled between a line of the power supply voltage and the first node and is made conductive in writing operation.

3. The semiconductor memory device according to claim 1, wherein the first precharge circuit includes a third transistor which is coupled between the line of the power supply voltage and the second node and is made conductive in response to a digit line precharge signal.

4. The semiconductor memory device according to claim 1, wherein the bit line driver comprises:
   a fourth transistor which is provided in correspondence with a bit line, coupled between one end of the corresponding bit line and a third node, and made conductive when the corresponding bit line is selected by the column decoder;
   a fifth transistor which is provided in correspondence with a bit line, coupled between the other end of the corresponding bit line and a fourth node, and made conductive when the corresponding bit line is selected by the column decoder;
   a sixth transistor which is made conductive in the case of writing a data signal of a first logic to apply the power supply voltage to the third node;
   a seventh transistor which is made conductive in the case of writing a data signal of the first logic to apply the reference voltage to the fourth node;
   an eighth transistor which is made conductive in the case of writing a data signal of the second logic to apply the power supply voltage to the fourth node;
   a ninth transistor which is made conductive in the case of writing a data signal of the second logic to apply the reference voltage to the third node; and
   a second precharge circuit for charging the third and fourth nodes to a second voltage before the sixth and seventh transistors or the eighth and ninth transistors are made conductive.

5. The semiconductor memory device according to claim 4, wherein the bit line driver further includes:
   a second constant current element coupled in series with the seventh transistor between the fourth node and the line of the reference voltage and making second constant current flow; and
   a third constant current element coupled in series with the ninth transistor between the third node and the line of the reference voltage and making the second constant current flow.

6. The semiconductor memory device according to claim 4, wherein the second precharge circuit includes:
   a tenth transistor which is coupled between the line of the power supply voltage and the third node and is made conductive in response to a bit line precharge signal; and
   an eleventh transistor which is coupled between the line of the power supply voltage and the fourth node and is made conductive in response to the bit line precharge signal.

7. A semiconductor memory device comprising:
   a memory array including: a plurality of memory cells arranged in a plurality of rows and a plurality of columns and each magnetically storing a data signal; a plurality of digit lines provided in correspondence with the rows; and a plurality of bit lines provided in correspondence with the columns;
   a row decoder for selecting any digit line in the digit lines in accordance with a row address signal;
   a column decoder for selecting any bit line in the bit lines in accordance with a column address signal;
   a digit line driver for making magnetization current flow to the digit line selected by the row decoder to activate memory cells corresponding to the digit line; and
   a bit line driver for making write current flow in a direction according to logic of a data signal to the bit line selected by the column decoder to write the data signal to the activated memory cell,
   wherein the bit line driver includes:
   a first transistor which is provided in correspondence with a bit line, coupled between one end of the corresponding bit line and a first node, and made conductive when the corresponding bit line is selected by the column decoder;
   a second transistor provided in correspondence with a bit line, coupled between the other end of the corresponding bit line and a second node, and made conductive when the corresponding bit line is selected by the column decoder;

a third transistor which is made conductive in the case of writing a data signal of a first logic to apply the power supply voltage to the first node;

a fourth transistor which is made conductive in the case of writing a data signal of the first logic to apply the reference voltage to the second node;

a fifth transistor which is made conductive in the case of writing a data signal of a second logic to apply the power supply voltage to the second node;

a sixth transistor which is made conductive in the case of writing a data signal of the second logic to apply the reference voltage to the first node; and a precharge circuit for charging the first and second nodes to a predetermined voltage before the third and fourth transistors or the fifth and sixth transistors are made conductive.

8. The semiconductor memory device according to claim 7, wherein the bit line driver further includes:

a first constant current element coupled in series with the fourth transistor between the second node and the line of the reference voltage and making predetermined current flow; and a second constant current element coupled in series with the sixth transistor between the first node and the line of the reference voltage and making the predetermined current flow.

9. The semiconductor memory device according to claim 7, wherein the precharge circuit includes:

a seventh transistor which is coupled between the line of the power supply voltage and the first node and is made conductive in response to a bit line precharge signal; and an eighth transistor which is coupled between the line of the power supply voltage and the second node and is made conductive in response to the bit line precharge signal.

10. A semiconductor memory device comprising:

a plurality of memory cells arranged in rows and columns and each magnetically storing data;

a plurality of write current lines arranged in correspondence with rows or columns of the memory cells, and making write current flow on the basis of the potential difference between first and second potentials at the time of writing data to a memory cell;

a plurality of transfer gate transistors provided in correspondence with the write current lines, each having one conduction terminal coupled to corresponding write current lines, and each selectively made conductive in response to an address signal;

a plurality of common wires to each of which a predetermined number of other conduction terminals of the transfer gate transistors are commonly coupled; and a plurality of write precharge circuits provided in correspondence with the common wires, and each precharging a corresponding common wire to a third potential before a corresponding transfer gate transistor is made conductive at the time of the data writing.

* * * * *